US009999129B2

(12) United States Patent
Guzek et al.

(10) Patent No.: US 9,999,129 B2
(45) Date of Patent: Jun. 12, 2018

(54) MICROELECTRONIC DEVICE AND METHOD OF MANUFACTURING SAME

(75) Inventors: John S. Guzek, Chandler, AZ (US); Mihir K. Roy, Chandler, AZ (US); Brent M. Roberts, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 1156 days.

(21) Appl. No.: 12/590,650

(22) Filed: Nov. 12, 2009

(65) Prior Publication Data

US 2011/0108947 A1 May 12, 2011

(51) Int. Cl.
*H01L 25/065* (2006.01)
*H01L 23/498* (2006.01)
(Continued)

(52) U.S. Cl.
CPC .............. *H05K 1/165* (2013.01); *H01L 24/16* (2013.01); *H01L 2224/16* (2013.01); *H01L 2924/14* (2013.01); *H01L 2924/15311* (2013.01); *H05K 1/0254* (2013.01); *H05K 1/0262* (2013.01); *H05K 1/116* (2013.01); (Continued)

(58) Field of Classification Search
CPC . H01L 2224/73253; H01L 2924/16152; H01L 2924/3011; H01L 2224/16; H01L 2924/00; H01L 2924/15311; H01L 2924/10253; H01L 2924/13091; H01L 2224/48227; H01L 2224/73265; H01L 25/16; H01L 39/16; H01L 2224/13025; H01L 2224/16227; H01L 2225/06513; H01L 2225/06517; H01L 2225/06527; H01L 2225/06541; H01L 2924/14;
(Continued)

(56) References Cited

U.S. PATENT DOCUMENTS 5,311,402 A * 5/1994 Kobayashi .............. H01L 21/52
174/17.05
5,349,743 A * 9/1994 Grader ................ H01F 17/0033
156/89.12
(Continued)

FOREIGN PATENT DOCUMENTS

TW    2009-43440 A1   10/2009
TW       200943440      10/2009
WO    2011/059569 A1    5/2011

OTHER PUBLICATIONS

Skeete et al. "Integrated Circuit Packages Including High Density Bump-Less Build Up Layers and a Lesser Density Core or Coreless Substrate," U.S. Appl. No. 11/860,922, filed Sep. 25, 2007, 19 pages.
(Continued)

Primary Examiner — Mary Wilczewski
Assistant Examiner — Tsz Chiu
(74) Attorney, Agent, or Firm — Schwabe, Williamson & Wyatt, P.C.

(57) ABSTRACT

A microelectronic device comprises a first substrate (110) having a first electrically conductive path (111) therein and a second substrate (120) above the first substrate and having a second electrically conductive path (121) therein, wherein the first electrically conductive path and the second electrically conductive path are electrically connected to each other and form a portion of a current loop (131) of an inductor (130).

9 Claims, 3 Drawing Sheets

(51) Int. Cl.
*H01L 23/64* (2006.01)
*H05K 1/16* (2006.01)
*H01L 23/00* (2006.01)
*H05K 1/02* (2006.01)
*H05K 1/11* (2006.01)

(52) U.S. Cl.
CPC ............... *H05K 2201/096* (2013.01); *H05K 2201/09509* (2013.01); *H05K 2201/09527* (2013.01); *H05K 2201/10378* (2013.01); *H05K 2203/1572* (2013.01)

(58) Field of Classification Search
CPC . H01L 2924/15174; H01L 2924/15192; H01L 2924/19041; H01L 2924/19042
USPC .................................. 257/E23.062; 336/200
See application file for complete search history.

(56) References Cited

U.S. PATENT DOCUMENTS

| | | | |
|---|---|---|---|
| 5,784,269 A | 7/1998 | Jacobs et al. | |
| 6,323,735 B1 | 11/2001 | Welland et al. | |
| 6,362,986 B1 | 3/2002 | Schultz et al. | |
| 6,452,247 B1 | 9/2002 | Gardner | |
| 6,525,414 B2* | 2/2003 | Shiraishi | H01L 21/563 257/668 |
| 6,541,948 B1* | 4/2003 | Wong | 323/284 |
| 6,594,153 B1* | 7/2003 | Zu | H01L 23/49822 174/250 |
| 6,680,544 B2* | 1/2004 | Lu | H01L 24/02 257/773 |
| 6,727,154 B2 | 4/2004 | Gardner | |
| 6,856,226 B2 | 2/2005 | Gardner | |
| 6,856,228 B2 | 2/2005 | Gardner | |
| 6,870,456 B2 | 3/2005 | Gardner | |
| 6,880,232 B2 | 4/2005 | La Valle et al. | |
| 6,891,461 B2 | 5/2005 | Gardner | |
| 6,943,658 B2 | 9/2005 | Gardner | |
| 6,988,307 B2 | 1/2006 | Gardner | |
| 7,064,646 B2 | 6/2006 | Gardner | |
| 7,141,883 B2 | 11/2006 | Wei et al. | |
| 7,195,981 B2 | 3/2007 | Lotfi et al. | |
| 7,307,340 B2* | 12/2007 | Baek | H01L 23/5227 257/723 |
| 7,436,277 B2 | 10/2008 | Hazucha et al. | |
| 7,498,656 B2* | 3/2009 | Zhang | H01L 23/552 257/277 |
| 7,566,650 B2* | 7/2009 | Lin | H01L 24/11 257/E21.506 |
| 7,750,459 B2 | 7/2010 | Dang et al. | |
| 7,858,441 B2* | 12/2010 | Lin | H01L 23/49816 438/107 |
| 8,272,741 B2* | 9/2012 | Husain | A61B 3/032 351/239 |
| 8,343,809 B2* | 1/2013 | Lin | H01L 21/563 257/E21.502 |
| 8,378,383 B2* | 2/2013 | Pagaila | H01L 21/568 257/125 |
| 8,487,444 B2* | 7/2013 | Law | H01L 21/76898 257/686 |
| 2003/0001287 A1* | 1/2003 | Sathe | H01L 23/49811 257/780 |
| 2003/0006474 A1 | 1/2003 | Gardner | |
| 2003/0081389 A1* | 5/2003 | Nair | H01L 25/16 361/764 |
| 2003/0218235 A1 | 11/2003 | Searls et al. | |
| 2004/0179383 A1 | 9/2004 | Edo et al. | |
| 2005/0045986 A1 | 3/2005 | Koo et al. | |
| 2005/0112842 A1* | 5/2005 | Kang et al. | 438/455 |
| 2005/0184844 A1 | 8/2005 | Valle et al. | |
| 2006/0063312 A1* | 3/2006 | Kurita | H01L 21/563 438/127 |
| 2006/0071649 A1 | 4/2006 | Schrom et al. | |
| 2007/0194427 A1 | 8/2007 | Choi et al. | |
| 2007/0268105 A1* | 11/2007 | Walls | 336/200 |
| 2008/0001698 A1 | 1/2008 | Hazucha et al. | |
| 2008/0002380 A1 | 1/2008 | Hazucha et al. | |
| 2008/0157330 A1* | 7/2008 | Kroehnert | H01L 21/4871 257/686 |
| 2009/0096289 A1* | 4/2009 | Briere | H01L 23/50 307/31 |
| 2011/0050334 A1* | 3/2011 | Pan | H01L 23/642 327/564 |
| 2011/0317387 A1* | 12/2011 | Pan | H01L 23/49822 361/782 |
| 2013/0020675 A1* | 1/2013 | Kireev | H01L 25/16 257/531 |

OTHER PUBLICATIONS

Guzek et al. "Microelectronic Package and Method of Manufacturing Same," Filed on Nov. 3, 2009, 25 pages.
Office Action received for Korean Patent Application No. 2012-7012099, dated May 10, 2013, 1 page of English Translation only.
International Preliminary Report on Patentability received for PCT Patent Application No. PCT/US2010/049521, dated May 24, 2012, 5 pages.
International Search Report and Written Opinion received for PCT Application No. PCT/US2010/049521, dated Apr. 28, 2011, 9 pages.
Official Letter and Search Report for Taiwan Patent Application No. 099131424 dated Jan. 22, 2015, 11 pages.
Office Action for Chinese Patent Application No. 201080051284.7 dated Aug. 4, 2014, 22 pages.
Official Letter along with Search Report (2 pages) from Taiwan Intellectual Property Office for Taiwan Patent Application No. 104136485 dated Dec. 1, 2016 and English Summary (1 page) thereof.
Notice of Allowance (2 pages) dated Aug. 12, 2016 by the Chinese Patent Office for Chinese Patent Application No. 201080051284.7 and English Translation (2 pages) thereof.
Notice of Allowance (2 pages) dated Apr. 11, 2017 by the Taiwan Intellectual Property Office for Taiwan Patent Application No. 104136485 and English Translation (1 )pages) thereof.

* cited by examiner

MICROELECTRONIC DEVICE AND METHOD OF MANUFACTURING SAME

FIELD OF THE INVENTION

The disclosed embodiments of the invention relate generally to microelectronic device packaging, and relate more particularly to inductive loops in microelectronic device packaging.

BACKGROUND OF THE INVENTION

Integrated circuit dies and other microelectronic devices are typically enclosed within a package that, among other functions, enables electrical connections to be made between the die and a socket, a motherboard, or another next-level component. As die sizes shrink and interconnect densities increase, such electrical connections must be scaled so as to match both the smaller pitches typically found at the die and the larger pitches typically found at the next-level component.

One approach to interconnect scaling within microelectronic packages is to use multiple substrates to handle the space transformation from die bump pitch, where a typical pitch value may be 150 micrometers (microns or μm) to system board level pitch, where a typical pitch value may be 1000 μm, i.e., 1.0 millimeter (mm). This multiple-substrate architecture requires one or more of the substrates to be thinner than a typical server substrate (having a 400 μm core compared to an 800 μm core, for example), in order to stay within maximum height requirements and to provide a solution for high speed input/output (I/O) signals.

BRIEF DESCRIPTION OF THE DRAWINGS

The disclosed embodiments will be better understood from a reading of the following detailed description, taken in conjunction with the accompanying figures in the drawings in which.

Figure 1:
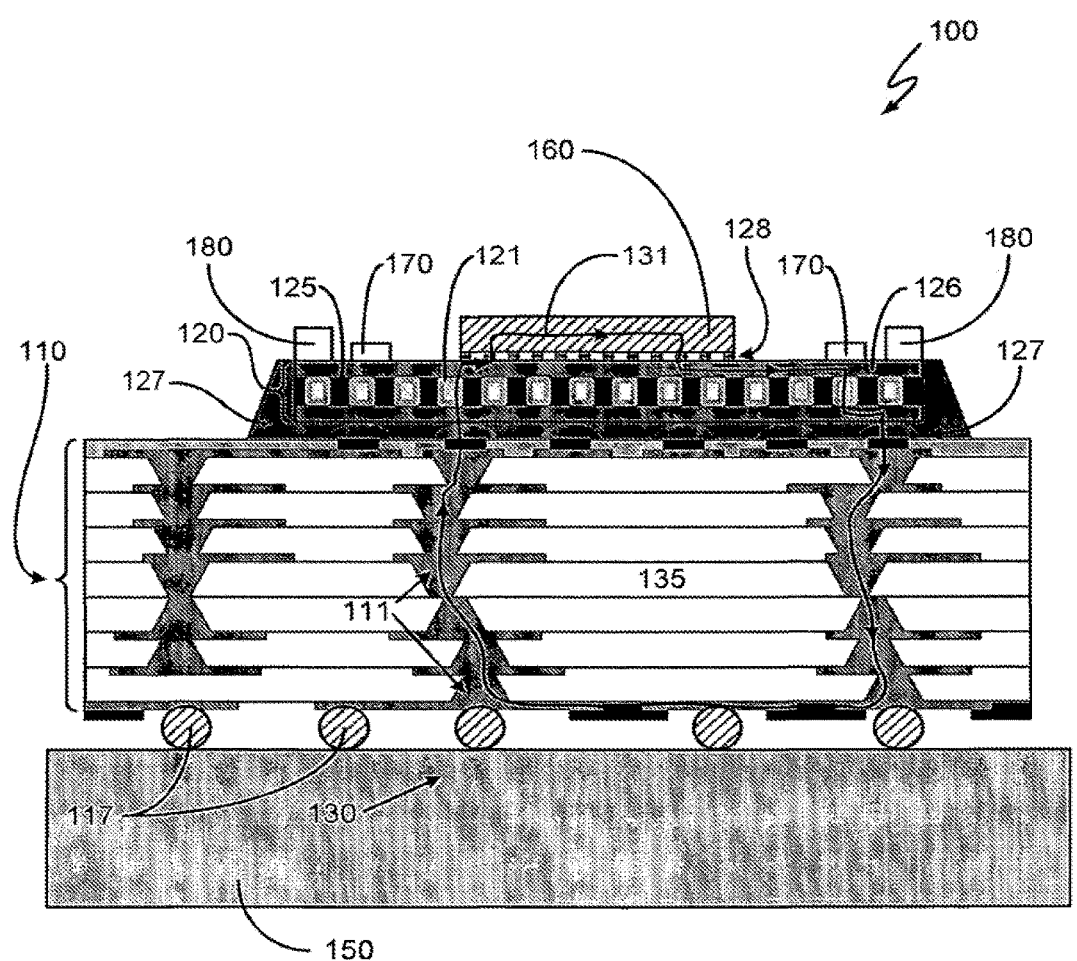
FIG. 1 is a cross-sectional view of a microelectronic device according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a microelectronic device comprises a first substrate having a first electrically conductive path therein and a second substrate above the first substrate and having a second electrically conductive path therein, wherein the first electrically conductive path and the second electrically conductive path are electrically connected to each other and form a portion of a current loop of an inductor.

It was mentioned above that a proposed multiple-substrate architecture requires one or more of the substrates to be thinner than a typical server substrate in order to stay within maximum height requirements and to provide a solution for high speed I/O signals. A key component for enabling a fully integrated voltage regulator (FIVR) on future generation products is an inductor contained within the microelectronic package. Currently, the best inductor structures use thick-core substrates with large plated through holes (PTHs), but high speed I/O demands require the use of thinner substrate cores with smaller PTHs. Cost pressures are also driving a trend toward thinner substrate cores. The need to use a thinner core, however, dictates that the current loop area in the inductor is reduced, leading to lower inductor performance.

On-package inductance is critical for enabling FIVR and future power delivery architectures. Embodiments of the invention address the inductor performance concerns by forming inductor structures continuously through both the first and second substrates. This architecture effectively increases the area (e.g., the length) of the current loop, leading to higher inductor performance. In other words, embodiments of the invention enable an increased separation (z-height) between inductor coils and back side metal, which is a key parameter to increase the inductor performance in an air core inductor. Embodiments of the invention thus address and resolve an inherent conflict between power delivery requirements and signal integrity requirements in future substrates.

Referring now to the drawings, FIG. 1 is a cross-sectional view of a microelectronic device 100 according to an embodiment of the invention. As illustrated in FIG. 1, microelectronic device 100 comprises a substrate 110 having an electrically conductive path 111 therein.

Substrate 110 may comprise any suitable type of package substrate or other die carrier. In one embodiment, the substrate 110 comprises a multilayer substrate including a number of alternating layers of metallization and dielectric material. Each layer of metallization comprises a number of conductors (e.g., traces), and these conductors may comprise any suitable conductive material, such as copper. Further, each metal layer is separated from adjacent metal layers by the dielectric layers, and adjacent metal layers may be electrically interconnected by microvias or other conductive vias. The dielectric layers may comprise any suitable insulating material—e.g., polymers, including both thermoplastic and thermosetting resins or epoxies, ceramics, etc.—and the alternating layers of metal and dielectric material may be built-up over a core layer of a dielectric material (or perhaps a metallic core).

As an example, and as illustrated in FIG. 1, electrically conductive path 111 can comprise one or more microvias that electrically connect adjacent internal layers of substrate 110. Such microvias can be arranged one on top of another in a straight line or they can be staggered such that they only partially overlap. Another possible microvia arrangement is one in which the microvias do not overlap at all but rather are connected by electrically conductive traces that run between them. As another example, electrically conductive path 111 can comprise a plated through hole or the like that extends throughout the entire extent of substrate 110.

Microelectronic device 100 further comprises a substrate 120 that is located above substrate 110 and has an electrically conductive path 121 therein, and a die 160 located above substrate 120. Although electrically conductive path is shown as passing into die 160, corresponding electrically conductive paths of other (non-illustrated) embodiments may instead pass underneath the die without extending into it. Microelectronic device 100 may further comprise die-side capacitors 170 and/or additional components 180, which, for example, could be resistors, capacitors, inductors, active devices, stiffeners, or the like.

In one embodiment, substrate 120 has a substrate core having a thickness that is no greater than 400 μm. As an example, electrically conductive path 121 can comprise a plated through hole or the like that extends through a core 125 of substrate 120. Electrically conductive path 121 may then further comprise a metal trace or the like that passes through build-up or similar layers 126 that surround core 125. Alternatively, substrate 120 may be made up entirely of such build-up or similar layers and may not have a core, in which case substrate 120 may have a total thickness in a range of approximately 200-500 μm.

Whatever their details, electrically conductive paths 121 and 111 are electrically connected to each other and form a portion of a current loop 131 of an inductor 130. A conceptualized depiction of current loop 131 is shown in plan view in FIG. 3, described below.

To reiterate concepts that were touched upon earlier herein, or that are otherwise relevant to the current discussion, the precise regulation of power is an increasingly-important function of high-density, high-performance microelectronic devices. Local voltage regulators, including FIVRs, are essential components of this effort; high-quality integrated passive devices, including inductors, are, in turn, important components of functioning voltage regulators. Accordingly, inductor 130 may be useful in managing power regulation for microelectronic device 100. Among other things, this means that inductor 130 may be a component of, or may be connected to, voltage regulation circuitry in die 160.

The inductor structure of embodiments of the invention may experience increased performance by voiding metal (e.g., copper) in the region of substrate 110 that lies within the inductor core area during manufacture of the substrate. This process does not require any special procedures and thus does not increase costs over those associated with the normal manufacturing process of substrate 110. Accordingly, in one embodiment inductor 130 has a core 135 that is characterized by an absence of metal. In other words, in one embodiment, inductor 130 acts like an air core inductor.

In one embodiment, microelectronic device 100 may be used as a way to achieve pitch translation between a die and an associated printed circuit board (PCB) or the like. To that end, the system level interface at the PCB (indicated by reference numeral 150 in FIG. 1) may be handled by substrate 110, while the die level interface may be handled by substrate 120. In a particular manifestation of this (or another) embodiment, substrate 110 has a first surface area and comprises a set of interconnects 117 having a first pitch, substrate 120 has a second surface area and comprises a set of interconnects 127 having a second pitch at a first surface thereof and a set of interconnects 128 having a third pitch at a second surface thereof. It should be noted that substrate 120 is coupled to substrate 110 using interconnects 127, the first pitch is larger than the second pitch, which in turn is larger than the third pitch, and the first surface area is larger than the second surface area. In this embodiment, interconnects 117 form part of electrically conductive path 111 and interconnects 127 and 128 form part of electrically conductive path 121.

Figure 2:
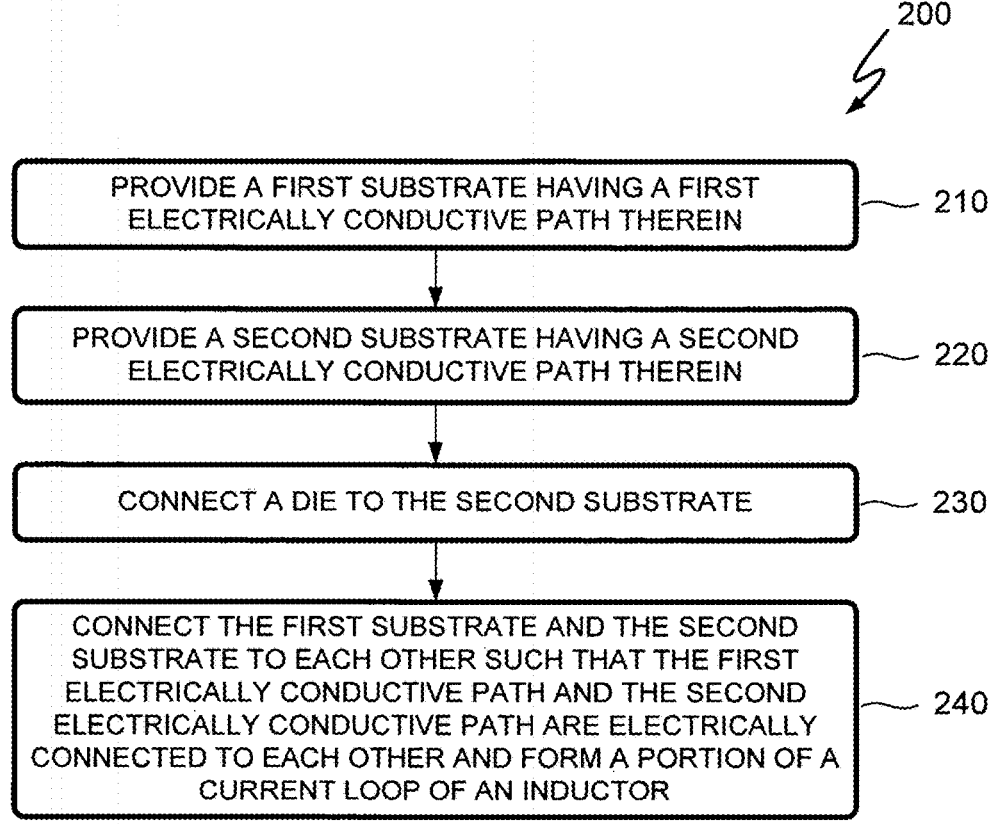
FIG. 2 is a flowchart illustrating a method of manufacturing a microelectronic device according to an embodiment of the invention.

FIG. 2 is a flowchart illustrating a method 200 of manufacturing a microelectronic device according to an embodiment of the invention. As an example, method 200 may result in the formation of a microelectronic device that is similar to microelectronic device 100 that is first shown in FIG. 1.

A step 210 of method 200 is to provide a first substrate having a first electrically conductive path therein. As an example, the first substrate and the first electrically conductive path can be similar to, respectively, substrate 110 and electrically conductive path 111 that are both shown in FIG. 1. In one embodiment, step 210 comprises forming a first plurality of vias and a first plurality of traces therein. As an example, these can include components that are similar to those shown in FIG. 1.

A step 220 of method 200 is to provide a second substrate having a second electrically conductive path therein. As an example, the second substrate and the second electrically conductive path can be similar to, respectively, substrate 120 and electrically conductive path 121 that are both shown in FIG. 1. In one embodiment, step 220 comprises forming a second plurality of vias and a second plurality of traces therein. As an example, these can include components that are similar to those shown in FIG. 1.

A step 230 of method 200 is to connect a die to the second substrate. As an example, the die can be similar to die 160 that is shown in FIG. 1.

A step 240 of method 200 is to connect the first substrate and the second substrate to each other such that the first electrically conductive path and the second electrically conductive path are electrically connected to each other and form a portion of a current loop of an inductor. As an example, the inductor and the current loop can be similar to, respectively, inductor 130 and current loop 131 that are both shown in FIG. 1. In one embodiment, step 240 comprises arranging the first and second pluralities of vias and the first and second pluralities of traces such that the portion of the current loop comprises a first one of the first plurality of vias, a first one of the second plurality of vias, a first one of the second plurality of traces, a second one of the second plurality of vias, a second one of the first plurality of vias, and a first one of the first plurality of traces.

In one embodiment, step 210, step 220, and/or another step of method 200 comprises voiding metal in a core of the inductor. As an example, this can comprise applying to at least one of the first substrate and the second substrate a mask that prevents metal from being formed in the inductor core.

Figure 3:
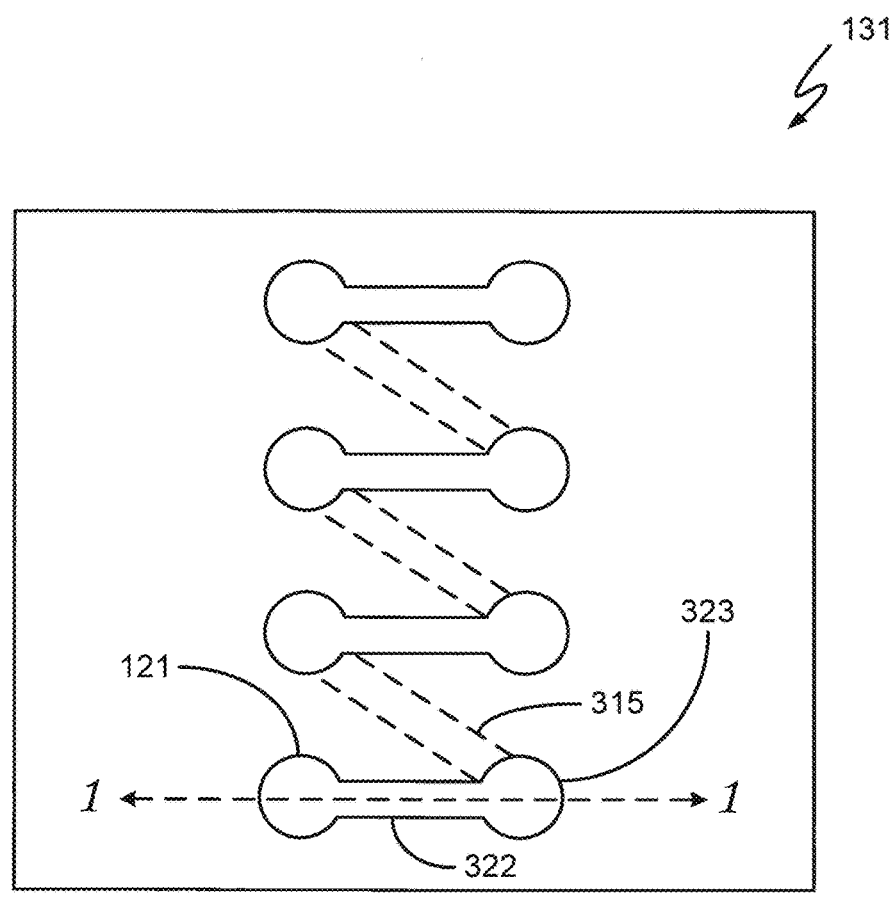
FIG. 3 is a conceptualized plan view of a current loop of the microelectronic device of FIG. 1 according to an embodiment of the invention.

FIG. 3 is a plan view of current loop 131 of microelectronic device 100 according to an embodiment of the invention. It will be readily apparent from its appearance that FIG. 3 is a highly-conceptualized drawing, included herein more for its broad structural overview than for its illustration of details. As shown, FIG. 3 is related to FIG. 1 in that FIG. 1 is a cross-section taken along line 1-1 in FIG. 3.

Visible in FIG. 3 is a top portion of electrically conductive path 121 as introduced in FIG. 1. Underneath that top portion, and thus not visible in FIG. 3, would be the balance of electrically conductive path 121 as well as electrically conductive path 111, along with other portions of current loop 131. The portion of current loop 131 represented in FIG. 3 by electrically conductive path 121, trace 322, and feature 323 corresponds roughly to the portion of current loop 131 that is visible in FIG. 1. Current loop 131 continues with additional electrically conductive features that correspond to those mentioned above and that collectively loop around a space that acts as a core of inductor 130.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the microelectronic device and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A microelectronic device comprising:
    a first substrate having a first electrically conductive path therein, wherein the first substrate comprises a multi-layer substrate including a number of alternating layers of metallization and dielectric material wherein the first substrate has a top surface opposite a bottom surface, wherein the top surface of the first substrate has a first surface area;
    a second substrate above the first substrate, the second substrate comprising a plurality of build-up layers and having a top surface opposite a bottom surface, wherein the bottom surface of the second substrate has a second surface area that is coplanar to the first surface area, the second substrate having a thickness that is less than the first substrate and a second electrically conductive path therein and wherein the bottom surface of the second substrate is adjacent to and separated from the top surface of the first substrate;
    a first set of interconnects coupling the bottom surface of the second substrate to the top surface of the first substrate, wherein the second surface area is less than the first surface area, and the second surface area is coupled to the first surface area with the first set of interconnects,
    wherein:
        the first electrically conductive path and the second electrically conductive path are electrically connected to each other and form a portion of a current loop of a multi-loop inductor having a plurality of current loops wherein each current loop of the multi-loop inductor has a common axis parallel with the first substrate and wherein the current loops of the multi-loop inductor are not coplanar with one another;
        wherein the bottom surface of the first substrate comprises a second set of interconnects having a second pitch; and
        wherein the bottom surface of the second substrate comprises the first set of interconnects having a first pitch and the top surface of the second substrate has a third set of interconnects having a third pitch, wherein:
        the second pitch is larger than the first pitch; and
        the first pitch is larger than the third pitch.

2. The microelectronic device of claim 1 wherein: the inductor has an inductor core that is characterized by an absence of metal.

3. The microelectronic device of claim 1 further comprising: a die containing voltage regulation circuitry, wherein the inductor is connected to the voltage regulation circuitry.

4. The microelectronic device of claim 1 wherein: the second substrate comprises a substrate core; and a thickness of the substrate core is no greater than 400 micrometers.

5. The microelectronic device of claim 1 wherein:
    the second set of interconnects form part of the first electrically conductive path; and the first set of interconnects form part of the second electrically conductive path.

6. A microelectronic device comprising:
    a first substrate having a first electrically conductive path therein, wherein the first substrate comprises a multi-layer substrate including a number of alternating layers of metallization and dielectric material wherein the first substrate has a top surface opposite a bottom surface, wherein the top surface of the first substrate has a first surface area;

a second substrate above the first substrate, the second substrate comprising a plurality of build-up layers and having a top surface opposite a bottom surface, wherein the bottom surface of the second substrate has a second surface area that is coplanar to the first surface area, the second substrate having a thickness that is less than the first substrate and a second electrically conductive path therein and wherein the bottom surface of the second substrate is adjacent to and separated from the top surface of the first substrate;

a first set of interconnections coupling the bottom surface of the second substrate to the top surface of the first substrate, wherein the second surface area is less than the first surface area, and the second surface area is coupled to the first surface area with the first set of interconnects; and a die above the second substrate, wherein:

the first electrically conductive path and the second electrically conductive path are electrically connected to each other and form a portion of a current loop of a multi-loop inductor having a plurality of current loops wherein each current loop of the multi-loop inductor has a common axis parallel with the first substrate and wherein the current loops of the multi-loop inductor are not coplanar with one another;

wherein the bottom surface of the first substrate comprises a second set of interconnects having a second pitch; and wherein the bottom surface of the second substrate comprises the first set of interconnects having a first pitch and the top surface of the second substrate has a third set of interconnects having a third pitch, wherein:

the second pitch is larger than the first pitch; and the first pitch is larger than the third pitch.

7. The microelectronic device of claim 6 wherein:

the inductor has an inductor core that is characterized by an absence of metal.

8. The microelectronic device of claim 6 wherein:

the second substrate comprises a substrate core; and a thickness of the substrate core is no greater than 400 micrometers.

9. The microelectronic device of claim 6 wherein:

the second set of interconnects form part of the first electrically conductive path; and the first set of interconnects form part of the second electrically conductive path.

* * * * *